(12) United States Patent
Chae

(10) Patent No.: US 10,446,614 B2
(45) Date of Patent: Oct. 15, 2019

(54) ORGANIC LIGHT-EMITTING DISPLAY DEVICE

(71) Applicant: LG Display Co., Ltd., Seoul (KR)

(72) Inventor: Hee-Young Chae, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/103,206

(22) Filed: Aug. 14, 2018

(65) Prior Publication Data
US 2019/0131355 A1     May 2, 2019

(30) Foreign Application Priority Data
Oct. 27, 2017   (KR) .................. 10-2017-0140857

(51) Int. Cl.
    H01L 51/52    (2006.01)
    H01L 27/32    (2006.01)
    G09G 3/3258   (2016.01)

(52) U.S. Cl.
    CPC ....... *H01L 27/3209* (2013.01); *G09G 3/3258* (2013.01); *H01L 27/326* (2013.01); *H01L 27/3211* (2013.01); *H01L 27/3216* (2013.01); *H01L 27/3258* (2013.01); *H01L 51/5206* (2013.01); *H01L 51/5221* (2013.01); *H01L 27/3246* (2013.01)

(58) Field of Classification Search
    CPC ..................... H01L 51/52; H01L 27/3218
    See application file for complete search history.

(56) References Cited

U.S. PATENT DOCUMENTS

| | | | |
|---|---|---|---|
| 10,224,501 B2* | 3/2019 | Choi | H01L 51/5088 |
| 2005/0270449 A1* | 12/2005 | Koma | G02F 1/133371 349/114 |
| 2009/0261715 A1* | 10/2009 | Sung | H01L 27/3213 313/504 |
| 2010/0052524 A1* | 3/2010 | Kinoshita | H01L 27/3213 313/504 |
| 2010/0156281 A1* | 6/2010 | You | H01L 27/3258 313/504 |
| 2012/0235178 A1* | 9/2012 | Mori | H01L 27/3211 257/88 |
| 2012/0319569 A1* | 12/2012 | Okamoto | H01L 27/322 313/504 |
| 2014/0117842 A1* | 5/2014 | Hanamura | H01L 27/322 313/504 |
| 2015/0041813 A1* | 2/2015 | Kim | H01L 27/124 257/59 |
| 2015/0102320 A1* | 4/2015 | Jung | H01L 27/3218 257/40 |
| 2015/0179944 A1* | 6/2015 | Chien | H01L 51/0013 438/35 |

(Continued)

*Primary Examiner* — George R Fourson, III
(74) *Attorney, Agent, or Firm* — Seed IP Law Group

(57) ABSTRACT

The present disclosure relates to an organic light-emitting display device capable of improving the aperture ratio thereof, and the organic light-emitting display device according to the present disclosure includes a plurality of sub-pixels respectively including organic emission layers arranged on a substrate, wherein a sub-pixel in which the organic emission layer is spaced a first vertical distance from the substrate and a sub-pixel in which the organic emission layer is spaced a second vertical distance from the substrate are alternatively arranged, thereby improving the aperture ratio.

10 Claims, 10 Drawing Sheets

(56) References Cited

U.S. PATENT DOCUMENTS

| | | | |
|---|---|---|---|
| 2015/0179945 A1* | 6/2015 | Chien | H01L 51/0013 |
| | | | 438/35 |
| 2015/0179946 A1* | 6/2015 | Chien | H01L 51/0013 |
| | | | 438/35 |
| 2016/0190213 A1* | 6/2016 | Kim | H01L 27/326 |
| | | | 257/40 |
| 2016/0343789 A1* | 11/2016 | Shi | H01L 51/52 |
| 2017/0287993 A1* | 10/2017 | Takata | H01L 27/3211 |
| 2018/0151825 A1* | 5/2018 | Choi | G06F 1/16 |
| 2018/0190732 A1* | 7/2018 | Lee | H01L 27/3211 |
| 2019/0067254 A1* | 2/2019 | Fu | H01L 25/0753 |

* cited by examiner

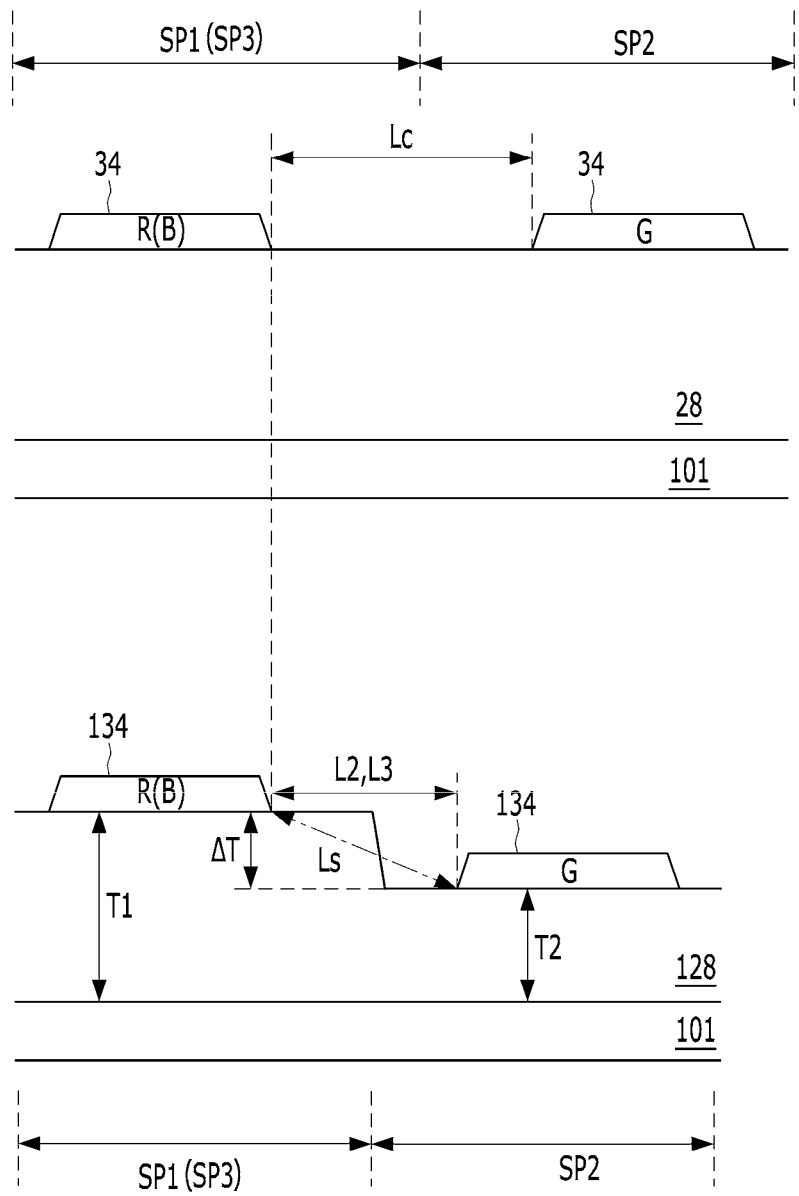

ORGANIC LIGHT-EMITTING DISPLAY DEVICE

CROSS-REFERENCE TO RELATED APPLICATION(S)

This application claims the benefit of Korean Patent Application No. 10-2017-0140857, filed on Oct. 27, 2018, which is hereby incorporated by reference as if fully set forth herein.

BACKGROUND

Technical Field

The present disclosure relates to an organic light-emitting display device and, more particularly, to an organic light-emitting display device capable of improving the aperture ratio thereof.

Description of the Related Art

Image display devices which realize various types of information as images are a core technology of the information communication society and are developed into thinner, lighter and more portable high-performance devices. An organic light-emitting diode (OLED) display which displays an image by controlling the quantity of light emitted from an emission layer is spotlighted as a flat panel display capable of reducing weight and volume, which are shortcomings of a cathode ray tube (CRT). Such an OLED display is a self-emissive display having low power consumption, a high response speed, high emission efficiency, a high luminance and a wide viewing angle.

Such an OLED display includes light-emitting elements and a pixel driving circuit composed of a plurality of thin film transistors for independently driving the light-emitting elements.

An emission layer included in the light-emitting element is formed through a deposition process using a metal mask. To prevent color mixing due to overlap between neighboring emission layers during the deposition process, neighboring emission layers are separated from each other by a long distance. In this case, a non-emission area is widened by the distance between emission layers, whereas emission regions which are deposition areas of the emission layers decrease, resulting in aperture ratio deterioration.

BRIEF SUMMARY

An object of the present disclosure to solve the aforementioned problem is to provide an organic light-emitting display device capable of improving the aperture ratio thereof.

To accomplish the object, an organic light-emitting display device according to the present disclosure includes a plurality of sub-pixels respectively including organic emission layers arranged on a substrate, a sub-pixel in which the substrate is spaced a first vertical distance from the organic emission layer and a sub-pixel in which the substrate is spaced a second vertical distance from the organic emission layer are alternately arranged. Accordingly, the present disclosure can improve the aperture ration of the organic light-emitting display device.

According to the present disclosure, a sub-pixel in which the substrate and the organic emission layer are separated from each other by the first vertical distance and a sub-pixel in which the substrate and the organic emission layer are separated from each other by the second vertical distance different from the first vertical distance are alternately arranged. Accordingly, a height difference is generated between neighboring organic emission layers which realize different colors in the present disclosure. Due to such a height difference, overlap between neighboring organic emission layers can be reduced during an organic emission layer deposition process, and thus a dead zone which is a non-emission area can be reduced. Therefore, the present disclosure can increase the aperture ratio to improve the lifespan and luminance of the organic light-emitting display device.

BRIEF DESCRIPTION OF THE SEVERAL VIEWS OF THE DRAWINGS

FIG. 4 is cross-sectional views for describing distances between sub-pixels of a conventional organic light-emitting display device of a comparative example and an organic light-emitting display device according to an embodiment of the present disclosure.

DETAILED DESCRIPTION

Embodiments of the present disclosure will be described in detail with reference to the attached drawings.

Figure 1:
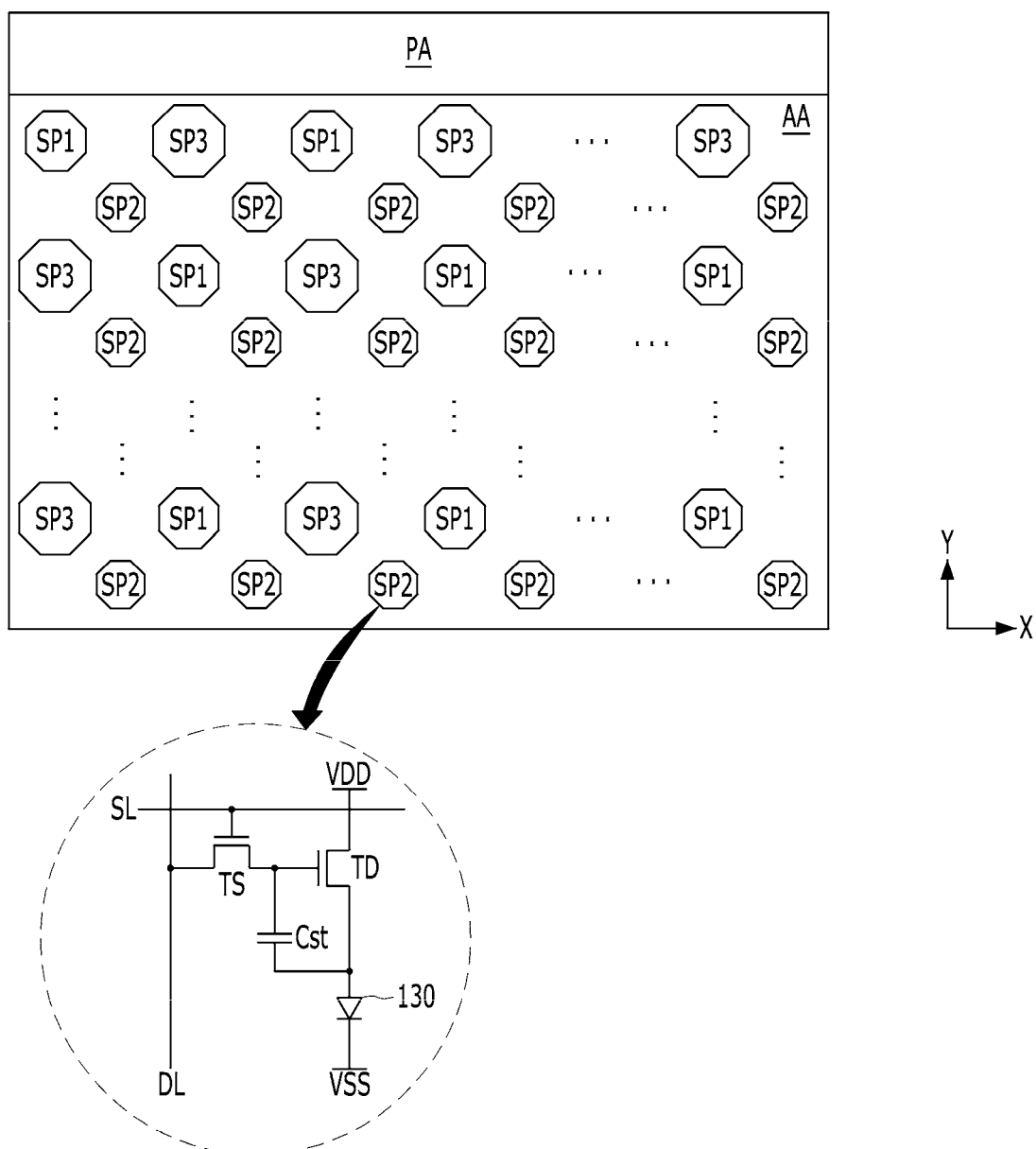
FIG. 1 is a plan view illustrating an organic light-emitting display device according to the present disclosure.

FIG. 1 is a plan view illustrating an organic light-emitting display device according to the present disclosure.

The organic light-emitting display device shown in FIG. 1 includes an active area AA and a pad area PA.

A plurality of pads through which driving signals are supplied to scan lines SL, data lines DL, a high voltage (VDD) supply line and a low voltage (VSS) supply line arranged in the active area AA is formed in the pad area PA.

The active area AA displays an image through unit pixels including light-emitting elements 130. A unit pixel is composed of a plurality of sub-pixels expressing different colors, a first sub-pixel SP1 expressing a first color, a second sub-pixel expressing a second color and a third sub-pixel expressing a third color.

Figure 2:
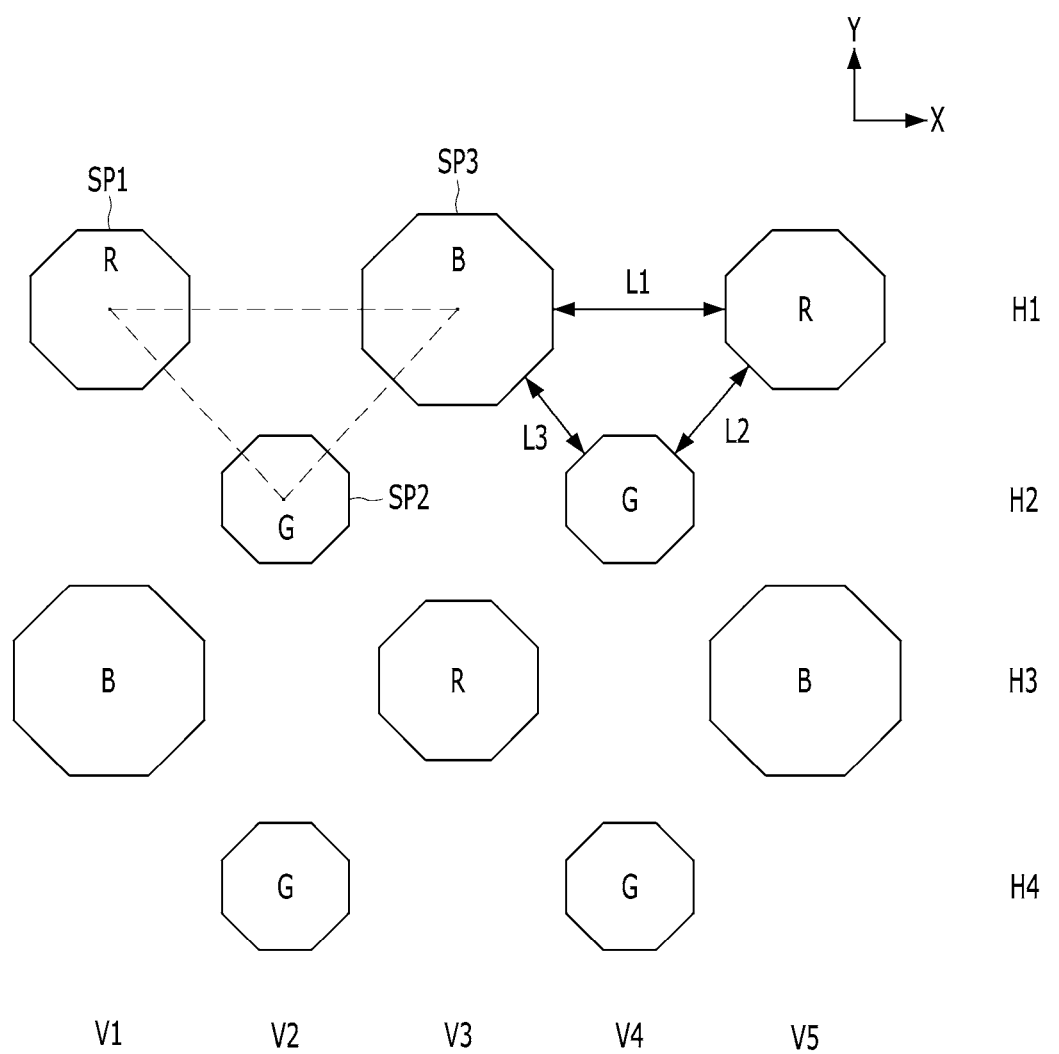
FIG. 2 is a plan view for describing first to third sub-pixels shown in FIG. 1 in more detail.

In the present disclosure, a unit pixel, which may also be called a pixel, composed of a first sub-pixel SP1 expressing red (R), a second sub-pixel SP2 expressing green (G) and a third sub-pixel SP3 expressing blue B, as shown in FIG. 2, is described as an example.

The first to third sub-pixels SP1, SP2 and SP3 are each formed in a polygonal, circular or oval shape. For example, the first to third sub-pixels SP1, SP2 and SP3 are formed in octahedral shapes, as shown in FIG. 2. Here, the shapes of the first to third sub-pixels SP1, SP2 and SP3 represent the shapes of organic emission layers included in the light-emitting elements 130.

The third sub-pixel SP3 expressing blue (B) which has a shorter lifespan than the first and second sub-pixels SP1 and SP2 expressing red (R) and green (G) has a larger area than the first and second sub-pixels SP1 and SP2. In addition, the second sub-pixel SP2 expressing green (G) has a smaller area than the first and third sub-pixels SP1 and SP3 expressing red (R) and blue (B) in order to adjust the color temperature to those of the first and third sub-pixels SP1 and SP3.

Within a pixel, the first to third sub-pixels SP1, SP2 and SP3 are arranged at intervals in a virtual triangular structure. That is, when the centers of the neighboring first to third sub-pixels SP1, SP2 and SP3 are connected, a virtual triangle is obtained with these sub-pixels as the vertices. Here, a longer side of the virtual triangle corresponds to a virtual line which connects the centers of the first and third sub-pixels SP1 and SP3, and the vertex positioned opposite to the longer side of the virtual triangle corresponds to the center of the second sub-pixel SP2. Each sub-pixel can be considered to be at a vertex of the triangle.

The first and third sub-pixels SP1 and SP3 are alternately arranged in odd-numbered sub-pixel columns V1, V3, V5, . . . extending in a first direction (X direction) in parallel with gate lines GL and odd-numbered sub-pixel rows H1, H3, H5, . . . extending in a second direction (Y direction) in parallel with data lines DL. The second sub-pixel SP2 is repeatedly arranged in even-numbered sub-pixel columns V2, V4, . . . and even-numbered sub-pixel rows H2, H4, . . . . The first sub-pixel SP1 faces the third sub-pixel SP3 in the first and second directions (X and Y directions). The first and third sub-pixels SP1 and SP3 face the second sub-pixel SP2 in diagonal directions.

As can be seen in the example of FIG. 2, the second color sub-pixel is positioned in at least one of an alternating column or row with that of the first and third color sub-pixels. For example, the first color sub-pixel is in row V1, the second color sub-pixel is row V2, the third color sub-pixel is in row V3, the second color sub-pixel is row V4, then the first color sub-pixel is in column V5, and it repeats. The second color sub-pixel is in alternating columns with the column that contains the first and third sub-pixels. Within the column that contains the first and third color sub-pixels, the first and third colors alternate with each other. Within this structure, the organic emission layer of the second color sub-pixel is a different vertical height from the substrate than that of the first and third color sub-pixels The example of FIG. 2 also shows and example, but it is not required according to this disclosure, that the second color sub-pixels are all in the same row and all sub-pixels in this row are comprised of the second color. On the other hand, the first and third color sub-pixels are all in the same row and the color alternates within the row. Further, the rows alternate with each other, with the rows having the second color sub-pixel alternating with the rows having the first and third color sub-pixels.

Accordingly, a horizontal distance L1 between the first sub-pixel SP1 and the third sub-pixel SP3 is longer than a horizontal distance L2 between the first sub-pixel SP1 and the second sub-pixel SP2 and a horizontal distance L3 between the third sub-pixel SP3 and the second sub-pixel SP2. Here, the horizontal distance L2 between the first sub-pixel SP1 and the second sub-pixel SP2 may be identical to or different from the horizontal distance L3 between the third sub-pixel SP3 and the second sub-pixel SP2.

A scan line SL, a data line DL, power lines through which a high voltage VDD and a low voltage VSS are provided, as shown in FIG. 1, are arranged between the first, second and third sub-pixels SP1, SP2 and SP3. In addition, each of the first, second and third sub-pixels SP1, SP2 and SP3 includes a pixel driving circuit and the light-emitting element 130 connected to the pixel driving circuit.

The pixel driving circuit includes a switching transistor TS, a driving transistor TD and a storage capacitor Cst.

The switching transistor TS turns on when a scan pulse signal is applied to the scan line to provide a data signal supplied to the data line to the storage capacitor Cst and the gate electrode of the driving transistor TD.

The storage capacitor Cst charges a difference voltage between the gate electrode and the source electrode of the driving transistor TD and provides the charged difference voltage as a driving voltage of the driving transistor TD.

The driving transistor TD adjusts the quantity of emitted light of the light-emitting element 130 by controlling current I supplied from the high voltage supply line to the light-emitting element 130 in response to a data signal supplied to the gate electrode 106 of the driving transistor TD. In addition, even when the switching transistor TS turns off, the driving transistor TD supplies constant current I according to the voltage charged in the storage capacitor Cst until a data signal of the next frame is provided such that the light-emitting element 130 maintains light emission.

Figure 3:
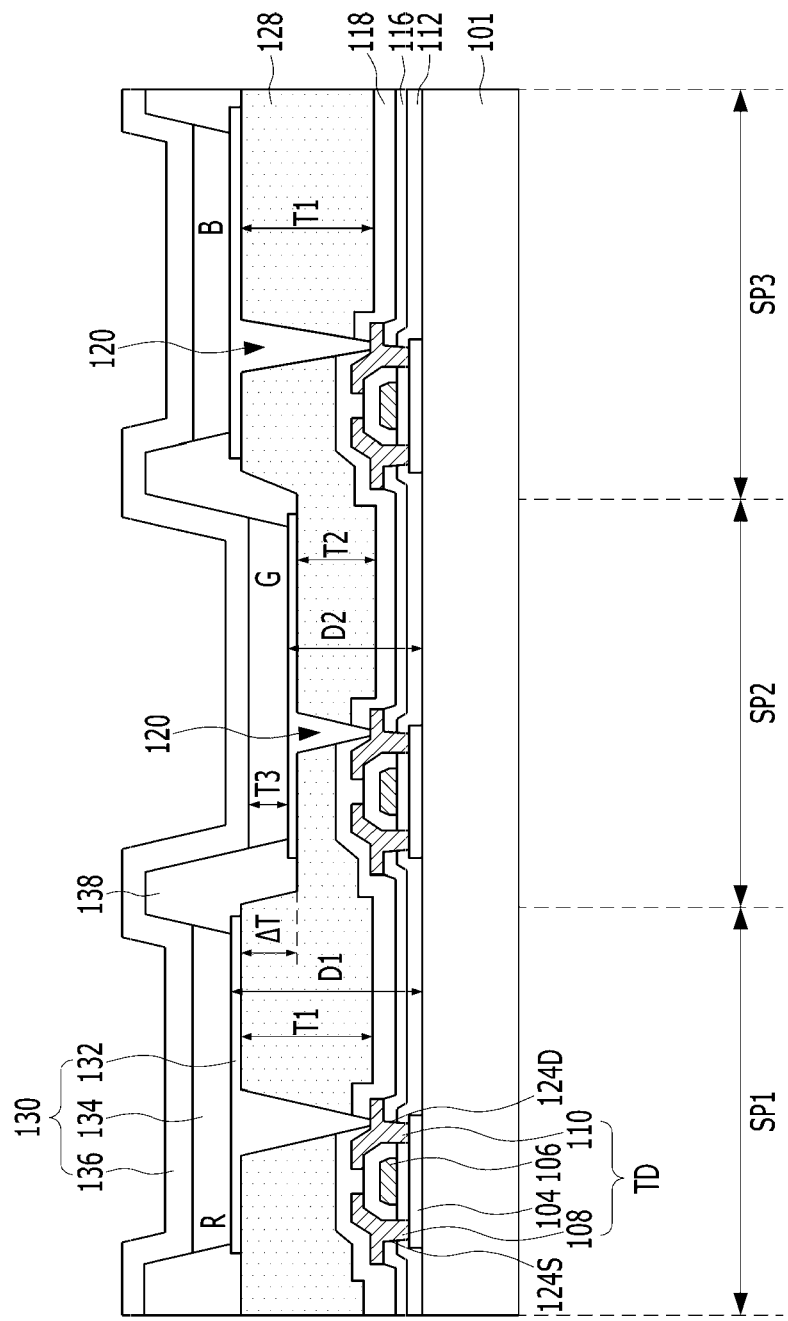
FIG. 3 is a cross-sectional view illustrating the first to third sub-pixels shown in FIG. 2.

The driving transistor TD includes the gate electrode 106, a source electrode 108, a drain electrode 110 and an active layer 104, as shown in FIG. 3.

The gate electrode 106 is formed on a gate insulating layer 112 covering the active layer 104. The gate electrode 106 is superposed on a channel region of the active layer 104 having the gate insulating layer 112 interposed therebetween. The gate electrode 106 may be a single layer or multiple layers formed of any one of Mo, Al, Cr, Au, Ti, Ni, Nd and Cu or an alloy thereof, but the present invention is not limited thereto.

The source electrode 108 is connected to a source region of the active layer 104 through a source contact hole 124S penetrating the gate insulating layer 112 and an interlevel insulating layer 116.

The drain electrode 110 is connected to a drain region of the active layer 104 through a drain contact hole 124D penetrating the gate insulating layer 112 and the interlevel insulating layer 116. In addition, the drain electrode 110 of the driving transistor TD is exposed through a pixel contact hole 120 formed to penetrate a passivation layer 118 to be connected to an anode electrode 132.

For example, the source electrode 108 and the drain electrode 110 may be a single layer or multiple layers formed of any one of Mo, Al, Cr, Au, Ti, Ni, Nd and Cu or an alloy thereof, but the present disclosure is not limited thereto.

The active layer 104 includes the channel region formed between the source electrode 108 and the drain electrode 110. The active layer 104 is formed on a substrate 101 and disposed under the gate electrode 106. The active layer 104 is formed of at least one of an amorphous semiconductor material, a polysilicon semiconductor material and an oxide semiconductor material.

A buffer layer and a light-shielding layer may be disposed between the active layer 104 and the substrate 101. The light-shielding layer is formed on the substrate 101 to be superposed on the active layer 104. The light-shielding layer absorbs or reflects light input thereto from outside and thus blocks external light input to the active layer 104. The buffer layer is formed of silicon oxide or silicon nitride in a monolayer or multilayer structure on the substrate 101 formed of a plastic resin such as glass or polyimide (PI). The buffer layer serves to aid in crystallization of the active layer 104 by preventing diffusion of moisture or impurities generated in the substrate 101 or controlling a heat transfer rate during crystallization.

The light-emitting element 130 includes the anode electrode 132 connected to the drain electrode 110 of the driving transistor TD, at least one organic emission layer 134 formed on the anode electrode 132, and a cathode electrode 136 formed on the organic emission layer 134 to be connected to the low voltage (VSS) supply line. Here, the low voltage (VSS) supply line serves to provide the low voltage VSS lower than the high voltage VDD supplied through the high voltage (VDD) supply line.

The anode electrode 132 contacts the drain electrode 110 exposed through the pixel contact hole 120 penetrating the passivation layer 118 and a planarization layer 128. The anode electrode 132 is disposed on the planarization layer 128 to be exposed in an emission area formed by a bank 138. In addition, the anode electrode 132 is superposed on the pixel driving circuit, and thus the emission area increases to improve the aperture ratio. The anode electrode 132 is formed in a multilayer structure including a transparent conductive layer and an opaque conductive layer having high reflection efficiency when applied to a top emission type organic light-emitting display device. The transparent conductive layer is formed of a material having a relatively large work function value, such as indium-tin-oxide (ITO) or indium-zinc-oxide (IZO) and the opaque conductive layer is formed in a monolayer or multilayer structure including Al, Ag, Cu, Pb, Mo, Ti or an alloy thereof. For example, the anode electrode 132 is formed in a structure in which a transparent conductive layer, an opaque conductive layer and a transparent conductive layer are sequentially laminated.

The cathode electrode 136 is formed on the surface and side of the organic emission layer 134 and the bank 138 to face the anode electrode 132 having the organic emission layer 134 interposed therebetween. The cathode electrode 136 is formed of a transparent conductive layer such as ITO or IZO when applied to a top emission type organic light-emitting display device.

The organic emission layer 134 is formed on the anode electrode 132 of the emission area formed by the bank 138. Hole-related layers including a hole injection layer and a hole transport layer are arranged between the organic emission layer 134 and the anode electrode 132 and electron-related layers including an electron injection layer and an electron transport layer are arranged between the organic emission layer 134 and the cathode electrode 136.

Meanwhile, the organic emission layer 134 of the first sub-pixel SP1 generates red (R) light, the organic emission layer 134 of the third sub-pixel SP3 generates blue (B) light, and the organic emission layer 134 of the second sub-pixel SP2 generates green (G) light.

The organic emission layers 134 of the first to third sub-pixels SP1, SP2 and SP3 are formed through a deposition process using a fine metal mask (FMM). Here, only the organic emission layers 134 may be formed through a deposition process using an FMM and the hole-related layers and the electron-related layers may be formed on the overall surface of each sub-pixel without the FMM. Alternatively, the hole-related layers and the electron-related layers as well as the organic emission layer 134 may be formed through a deposition process using an FMM.

Here, the organic emission layers 134 of the first to third sub-pixels SP1, SP2 and SP3 need to be a certain horizontal distance from each other in order to prevent color mixture between neighboring sub-pixels and to cause each sub-pixel to independently generate a color.

Since such a horizontal distance becomes a dead zone in which light is not substantially emitted, the present disclosure improves the aperture ratio by reducing horizontal distances between the first to third sub-pixels SP1, SP2 and SP3.

To this end, the present invention forms the organic light-emitting display device such that the vertical distance D2 between the organic emission layer 134 of the second sub-pixel SP2 arranged alternately with the first and third sub-pixels SP1 and SP3 in a zigzag form and the substrate 101 differs from the vertical distance D1 between the organic emission layer 134 of at least one of the first and third sub-pixels SP1 and SP3 and the substrate 101. That is, in the present disclosure, the vertical distance D2 between the lower surface of the organic emission layer 134 of the second sub-pixel SP2 and the upper surface of the substrate 101 is shorter than the vertical distance D1 between the lower surface of the organic emission layer 134 of at least one of the first and third sub-pixels SP1 and SP3 and the upper surface of the substrate 101. To achieve this, the gate insulating layer 112, the interlevel insulating layer 116, the passivation layer 118 and the planarization layer 128 interposed between the organic emission layers 134 and the substrate 101 are formed such that the thickness of at least one thereof differs from others. In the present disclosure, a structure in which the planarization layer 128 is formed to a different thickness from others is described as an example.

The thickness T2 of the planarization layer 128 of the second sub-pixel SP2 is less than the thickness T1 of the planarization layer 128 of the first and third sub-pixels SP1 and SP3. For example, the ratio (T1:T2) of the thickness T2 of the planarization layer 128 of the second sub-pixel SP2 to the thickness T1 of the planarization layer 128 of the first and third sub-pixels SP1 and SP3 is 5~10:1. Here, a difference T between the thickness T1 of the planarization layer 128 of the first and third sub-pixels SP1 and SP3 and the thickness T2 of the planarization layer 128 of the second sub-pixel SP2 is greater than the thickness T3 of the emission layer 134 of the third sub-pixel SP3.

FIG. 4 is a diagram for describing a distance between sub-pixels in an embodiment of the present disclosure and a comparative example.

A planarization layer 28 according to the comparative example is formed to the same thickness in sub-pixels, and thus organic emission layers 34 of first to third sub-pixels SP1, SP2 and SP3 are formed on the same plane. Accordingly, the organic emission layers 34 of the first to third sub-pixels SP1, SP2 and SP3 are separated from each other by a horizontal distance Lc in parallel with the upper surface of the substrate 101 on the planarization layer 28 having a uniform thickness in order to prevent color mixture between the organic emission layers of the first to third sub-pixels SP1, SP2 and SP3 generating different colors in the comparative example.

On the other hand, the planarization layer 134 according to an embodiment of the present disclosure is formed to a first thickness T1 in the first and third sub-pixels SP1 and SP3 and formed to a second thickness T2 less than the first thickness T1 in the second sub-pixel SP2. Due to such a thickness difference of the planarization layer 128, a height difference is generated between the organic emission layer 134 of the second sub-pixel SP2 and the organic emission layer 134 of the first and third sub-pixels SP1 and SP3. Due to this height difference, the organic emission layer 134 of the second sub-pixel SP2 is separated from the organic emission layer 134 of the first and third sub-pixels SP1 and SP3 by a diagonal distance Ls with respect to the upper surface of the substrate 101 and by a horizontal distance L2 or L3 shorter than the diagonal distance Ls. Here, when the diagonal distance Ls longer than the horizontal distance L2 or L3 in the embodiment is set to be identical to the horizontal distance Lc of the comparative example, color mixture caused by overlap between neighboring organic emission layers 134 in a deposition process for forming the organic emission layer 134 is prevented, improving deposition process reliability. Overlap between neighboring organic emission layers can be reduced in the organic emission layer deposition process according to the aforementioned height difference, and thus a dead zone which is a non-emission area can be decreased. The organic emission layer 134 of the second sub-pixel SP2 is disposed on a different plane from, that is, a lower plane than the plane on which the organic emission layer 134 of the first and third sub-pixels SP1 and SP3 is formed. Furthermore, since the horizontal distance L2 and L3 in the embodiment is shorter than the horizontal distance Lc in the comparative example, deposition areas of the organic emission layers 134 are widened in the embodiment of the present disclosure compared to the comparative example, and thus the aperture ratio is improved.

As can be known from Table 1, in an embodiment of the present disclosure in which the ratio of the thickness of the planarization layer 128 of the second sub-pixel SP2 to the thickness of the planarization layer 128 of the first and third sub-pixels SP1 and SP3 is 6~8:1, the aperture ratio is improved by 5.6% to 8.5% compared to a comparative example in which the thickness ratio is 1:1.

TABLE 1

| | Comparative example | Embodiment | | |
| --- | --- | --- | --- | --- |
| | | Case 1 | Case 2 | Case 3 |
| Ratio of Planarization layer thicknesses of subpixels (SP1:SP2:SP3) | 1:1:1 | 6:1:6 | 7:1:7 | 8:1:8 |
| Aperture ratio | — | 5.6% increase | 7% increase | 8.5% increase |

FIGS. 5a to 5e are cross-sectional diagrams for describing a method of manufacturing an organic light-emitting display device according to the present disclosure.

Figure 5A:
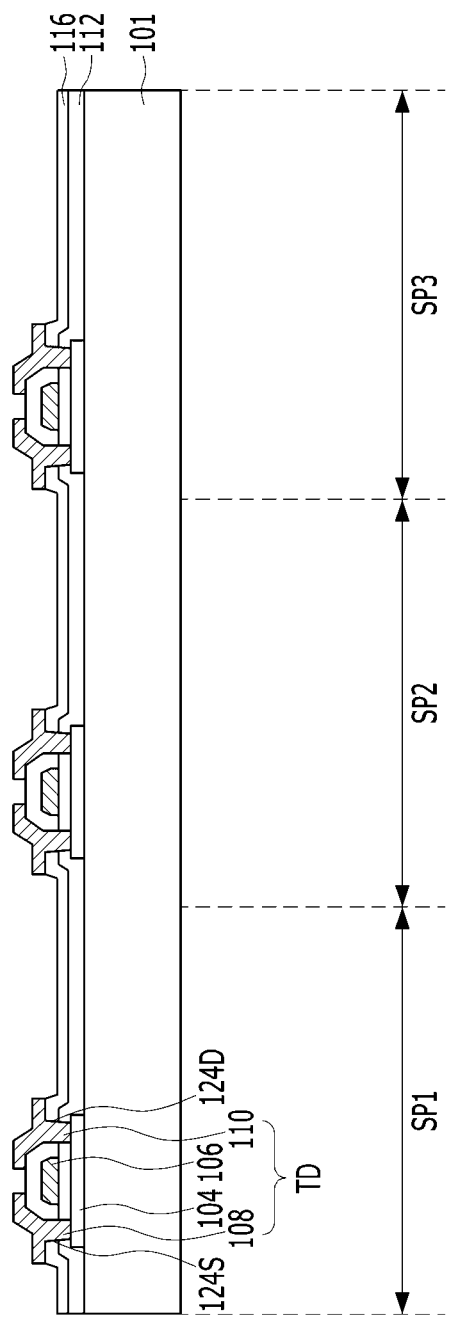
FIGS. 5a to 5e are cross-sectional views for describing a method of manufacturing the organic light-emitting display device shown in FIG. 3.

Referring to FIG. 5a, driving transistors TD are formed on the substrate 101.

Specifically, each driving transistor TD including the active layer 104, the gate electrode 106, and the source and drain electrodes 108 and 110 is formed on the substrate 101 through mask processes. The switching transistor TS and the storage capacitor Cst shown in FIG. 1 are formed simultaneously with the driving transistors TD through the mask processes used to form the driving transistor TD.

Figure 5B:
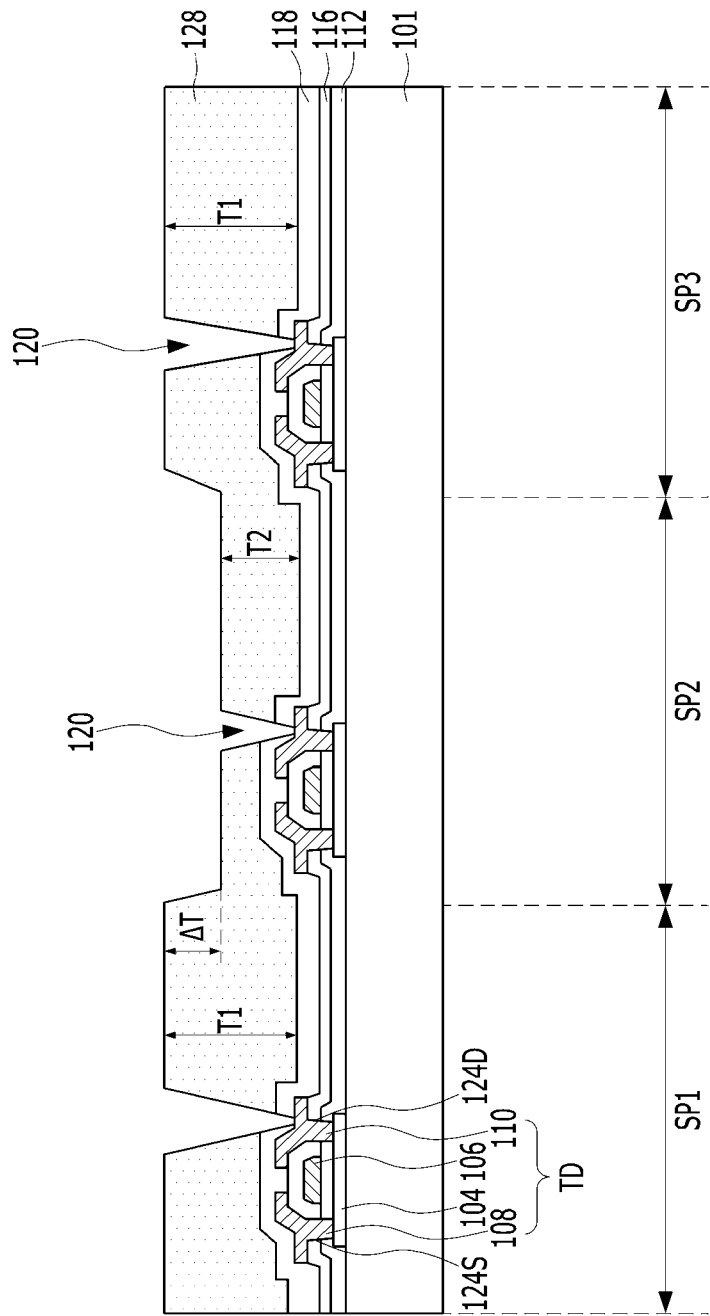

Then, an inorganic insulating material such as SiOX or SiNx is deposited on the overall surface of the interlevel insulating layer 116 on which the driving transistors TD are formed to form the passivation layer 118, as shown in FIG. 5b. Subsequently, an organic insulating material such as a photoacrylic resin is coated on the overall surface of the substrate 101 having the passivation layer 118 formed thereon to form the planarization layer 128.

Thereafter, the passivation layer 118 and the planarization layer 128 are patterned through a mask process. Accordingly, pixel contact holes 120 for exposing drain electrodes 110 are formed and the planarization layer 128 is formed to the first thickness T1 in the first and second sub-pixels SP1 and SP3 and to the second thickness T2 in the second sub-pixel SP2.

Figure 5C:
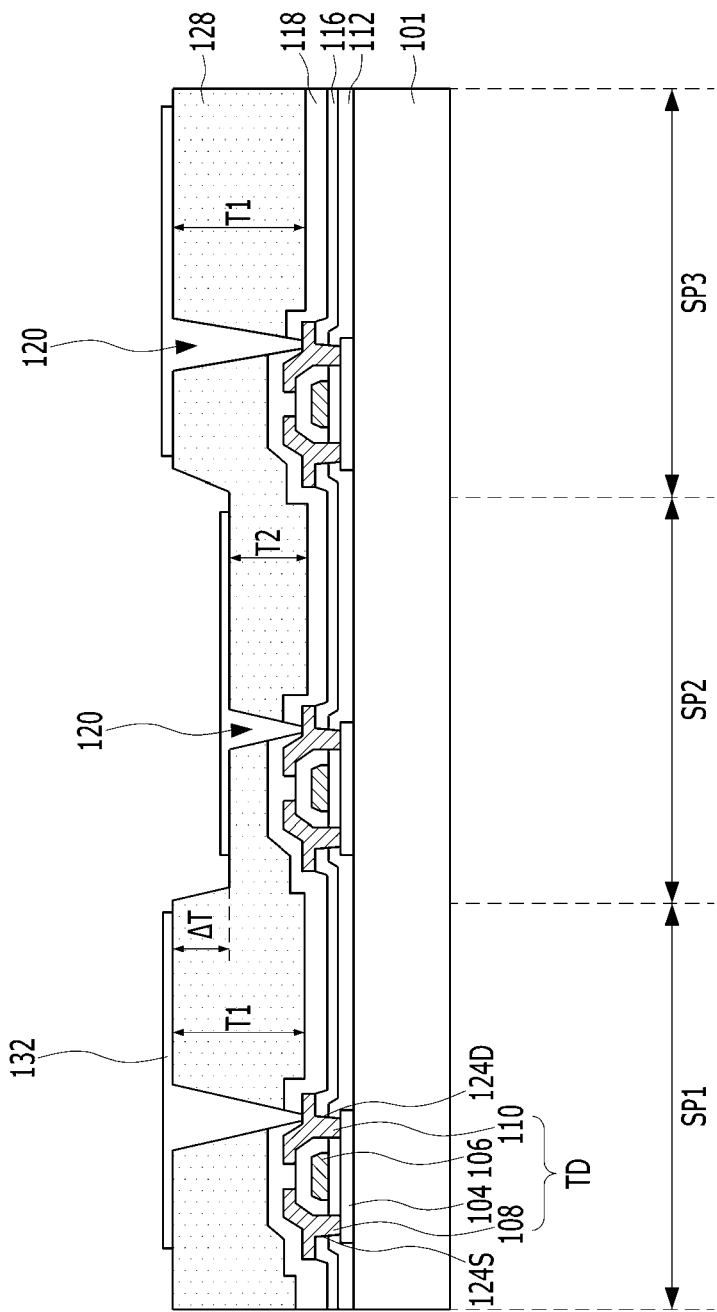

Subsequently, a conductive layer of least one layer including an opaque conductive layer is formed on the overall surface of the substrate 101 on which the pixel contact holes 120 have been formed and patterned through a mask process to form anode electrodes 132, as shown in FIG. 5c.

Figure 5D:
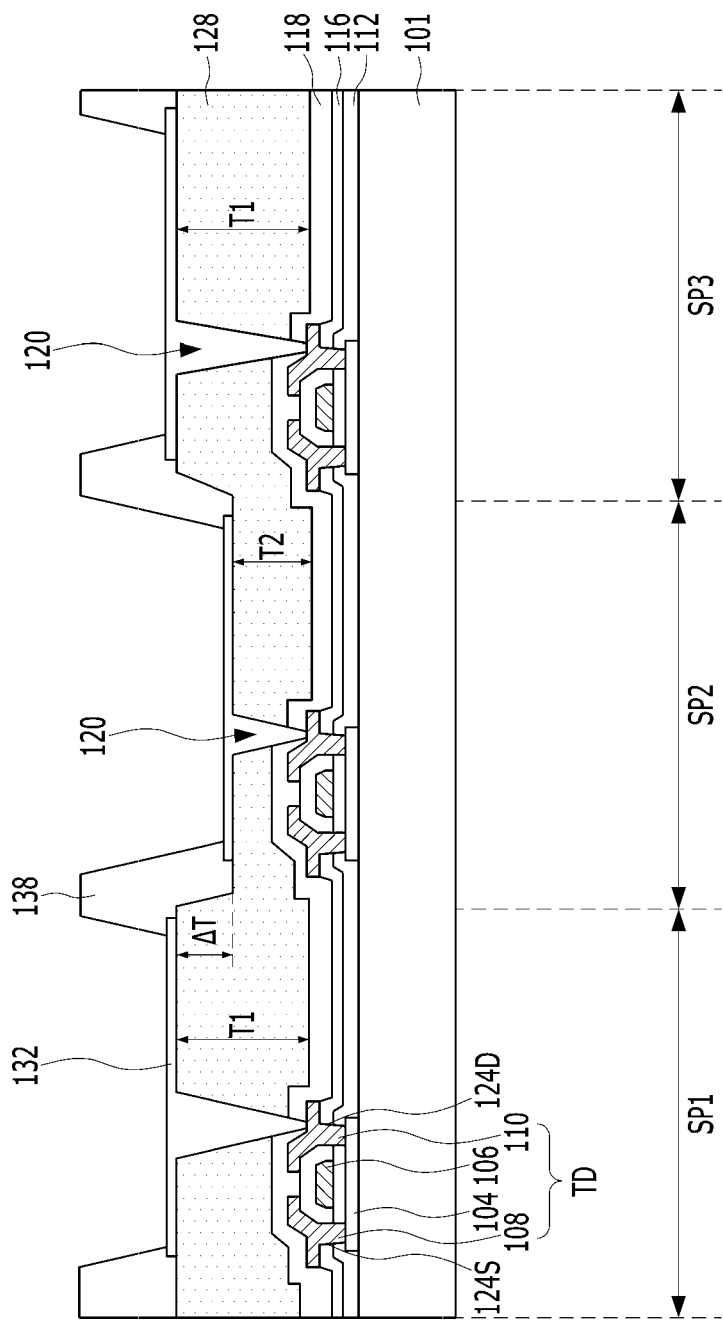
Figure 5E:
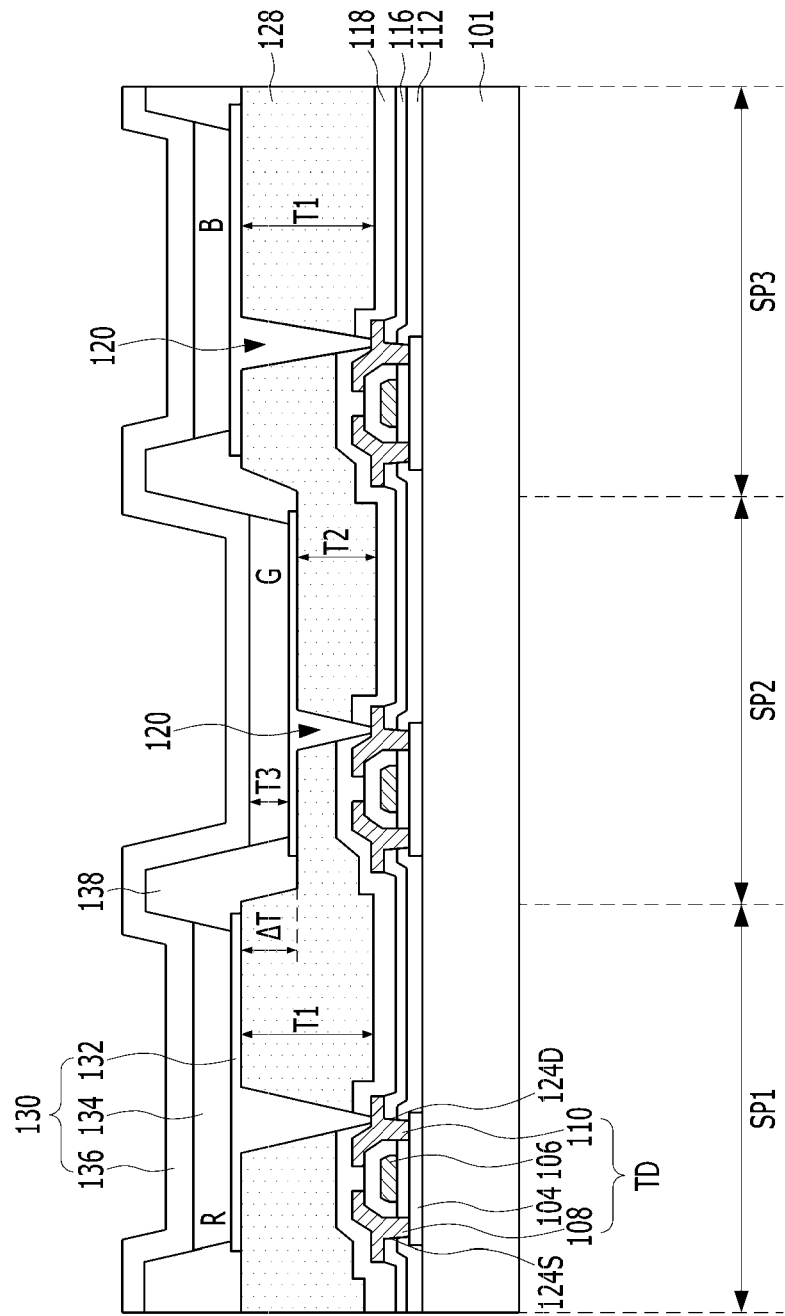

Thereafter, a photosensitive organic insulating layer is formed on the overall surface of the substrate 101 on which the anode electrodes 132 have been formed and then patterned through a mask process, to form the bank 138 as shown in FIG. 5d. The emission layer 134 is formed on the substrate 101 on which the bank 138 has been formed through a deposition process using fine metal mask, as shown in FIG. 5e, and a transparent conductive layer is formed on the emission layer 134 through deposition to form the cathode electrode 136.

Figure 6:
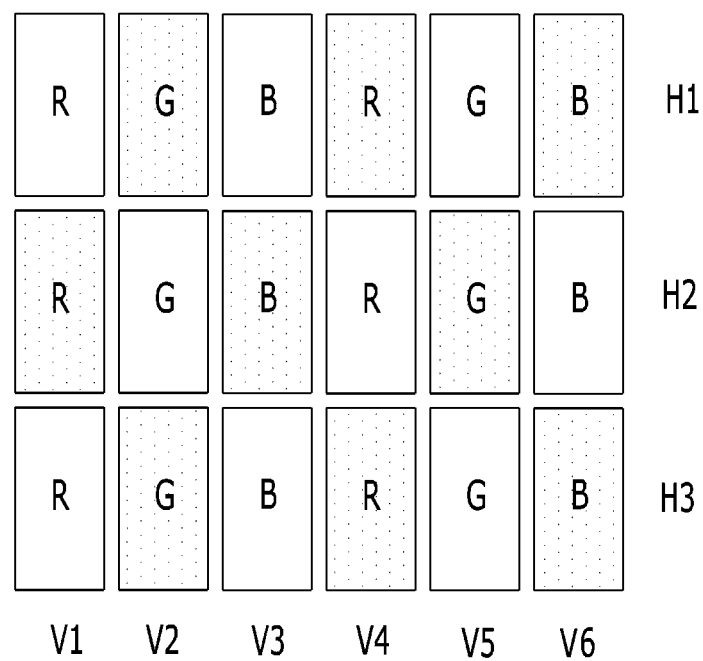
FIG. 6 is a plan view for describing sub-pixels of an organic light-emitting display device according to a second embodiment of the present disclosure in more detail.

Although a structure in which the first to third sub-pixels SP1, SP2 and SP3 constituting a unit pixel are separated from each other and arranged in a virtual triangle form has been described as an embodiment of the present disclosure, the present disclosure is applicable to a structure in which the first to third sub-pixels SP1, SP2 and SP3 or first to fourth sub-pixels are arranged in a row, as shown in FIG. 6. For example, the first sub-pixel SP1 is a red (R) sub-pixel expressing red, the second sub-pixel SP2 is a green (G) sub-pixel expressing green, the third sub-pixel SP3 is a blue (B) sub-pixel expressing blue, and the fourth sub-pixel is a white (W) sub-pixel expressing white.

In this case, a plurality of sub-pixels is arranged in such a manner that sub-pixels expressing the same color are arranged in one of a horizontal or vertical directions and sub-pixels expressing different colors are alternately arranged in the other direction. The substrate and the organic emission layer are separated from each other by one of first and second vertical distances in sub-pixels arranged in odd-numbered sub-pixel rows H1, H3, . . . and odd-numbered sub-pixel columns V1, V3, . . . , and the substrate and the organic emission layer are separated from each other by the other vertical distance in sub-pixels arranged in even-numbered sub-pixel rows H2, H4, . . . and even-numbered sub-pixel columns V2, V4, . . . . Here, the planarization layer 128 of sub-pixels in which the substrate 101 is separated from the organic emission layer 134 by the second vertical distance D2 is formed to a thickness less than the thickness of the planarization layer 128 of sub-pixels in which the substrate 101 is separated from the organic emission layer 134 by the first vertical distance D1.

Accordingly, a height difference is generated between neighboring organic emission layers which realize different colors in the present disclosure. Due to such a height difference, overlap between neighboring organic emission layers can be reduced during an organic emission layer deposition process, and thus a dead zone which is a non-emission area can be reduced. Therefore, the present disclosure can increase the aperture ratio to improve the lifespan and luminance of the organic light-emitting display device.

Those skilled in the art will appreciate that the present disclosure may be carried out in other specific ways than those set forth herein without departing from the spirit and essential characteristics of the present disclosure. The above embodiments are therefore to be construed in all aspects as illustrative and not restrictive. The scope of the disclosure should be determined by the appended claims and their legal equivalents, not by the above description, and all changes coming within the meaning and equivalency range of the appended claims are intended to be embraced therein.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An organic light-emitting display device comprising:
a plurality of pixels, each pixel being composed of a plurality of sub-pixels, each of the sub-pixels including an organic emission layer positioned on a substrate and a planarization layer between the organic emission layer and substrate,
wherein the planarization layer is spaced a first vertical distance from the substrate in at least one of the plurality of sub-pixels included in each pixel,
wherein the planarization layer is spaced a second vertical distance from the substrate that is shorter than the first vertical distance from the substrate in the another sub-pixel included in each pixel, and
wherein the sub-pixel in which the planarization layer is spaced the second vertical distance from the substrate is positioned between sub-pixels in which the planarization layer is spaced the first vertical distance from the substrate.

2. The organic light-emitting display device according to claim 1, wherein the pixel includes first, second and third sub-pixel, each sub-pixel outputting a different color,
wherein the first, second and third sub-pixels are separated from one another and arranged in a triangular structure with each sub-pixel positioned at a vertex of the triangle,
wherein the planarization layers of the first and third sub-pixels are spaced the first vertical distance from the substrate, and
wherein the planarization layer of the second sub-pixel is spaced the second vertical distance shorter than the first vertical distance from the substrate.

3. The organic light-emitting display device according to claim 2, wherein
the first sub-pixel is a red sub-pixel, the second sub-pixel is a green sub-pixel, and the third sub-pixel is a blue sub-pixel.

4. An organic light-emitting display device comprising:
a plurality of pixels, each pixel being composed of at least a first sub-pixel, a second sub-pixel and a third sub-pixel, each of the first to third sub-pixels including an organic emission layer positioned on a substrate,
wherein the organic emission layers of the first and third sub-pixels are spaced a first vertical distance from the substrate in each pixel,
wherein the organic emission layer of the second sub-pixel is spaced a second vertical distance from the substrate that is different from the first vertical distance from the substrate in the first sub-pixel, and
wherein a planarization layer disposed between the organic emission layer of the second sub-pixel and the substrate is thinner than a planarization layer disposed between the organic emission layer of at least one of the first and third sub-pixels and the substrate.

5. The organic light-emitting display device according to claim 4, wherein the first sub-pixel is a red sub-pixel, the second sub-pixel is a green sub-pixel, and the third sub-pixel is a blue sub-pixel.

6. The organic light-emitting display device according to claim 1, wherein the plurality of sub-pixels included in each pixel is arranged in such a manner that sub-pixels expressing a first color are arranged in one of a horizontal or vertical direction and sub-pixels expressing a second and third color are alternately arranged in the other direction,
the substrate and the planarization layer are arranged at one of the first and second vertical distances from each other in sub-pixels arranged in odd-numbered sub-pixel columns and odd-numbered sub-pixel rows, and
the substrate and the planarization layer are arranged at the other one of the first and second vertical distances from each other in sub-pixels arranged in even-numbered sub-pixel columns and even-numbered sub-pixel rows.

7. The organic light-emitting display device according to claim 6, wherein a planarization layer of a sub-pixel in which the planarization layer is spaced the second vertical distance from the substrate is thinner than a planarization layer of a sub-pixel in which the planarization layer is spaced the first vertical distance from the substrate.

8. The organic light-emitting display device according to claim 1, wherein the sub-pixel in which the planarization layer is spaced the first vertical distance from the substrate and the sub-pixel in which the planarization layer is spaced the second vertical distance from the substrate are positioned in alternating rows.

9. The organic light-emitting display device according to claim 1, wherein the sub-pixel in which the planarization layer is spaced the first vertical distance from the substrate and the sub-pixel in which the planarization layer is spaced the second vertical distance from the substrate are positioned in alternating columns.

10. The organic light-emitting display device according to claim 1, wherein the sub-pixel in which the planarization layer is spaced the first vertical distance from the substrate and the sub-pixel in which the planarization layer is spaced the second vertical distance from the substrate are positioned on a diagonal with respect to each other within a unit pixel.

* * * * *